(12) United States Patent
Boros et al.

(10) Patent No.: US 11,898,728 B2
(45) Date of Patent: Feb. 13, 2024

(54) FLEXIBLE LIGHT EMITTING DIODE (LED) SHEET SYSTEMS AND METHODS

(71) Applicant: Diodify, LLC, Frisco, TX (US)

(72) Inventors: James Boros, Colleyville, TX (US); Kelly Blackwood Carter, Colleyville, TX (US)

(73) Assignee: Diodify, LLC, Frisco, TX (US)

( * ) Notice: Subject to any disclaimer, the term of this patent is extended or adjusted under 35 U.S.C. 154(b) by 0 days.

(21) Appl. No.: 17/989,469

(22) Filed: Nov. 17, 2022

(65) Prior Publication Data

US 2023/0151951 A1 May 18, 2023

Related U.S. Application Data

(60) Provisional application No. 63/280,584, filed on Nov. 17, 2021.

(51) Int. Cl.

| F21V 19/00 | (2006.01) |
|---|---|
| H01L 25/075 | (2006.01) |
| H01L 33/62 | (2010.01) |
| F21V 23/00 | (2015.01) |
| H05K 1/02 | (2006.01) |
| F21Y 115/10 | (2016.01) |
| F21Y 113/13 | (2016.01) |
| F21Y 105/16 | (2016.01) |

(52) U.S. Cl.
CPC ........ *F21V 19/0015* (2013.01); *F21V 23/005* (2013.01); *H01L 25/0753* (2013.01); *H01L 33/62* (2013.01); *H05K 1/028* (2013.01); *F21Y 2105/16* (2016.08); *F21Y 2113/13* (2016.08); *F21Y 2115/10* (2016.08); *H05K 2201/10106* (2013.01)

(58) Field of Classification Search
CPC ............... F21V 19/0015; F21V 23/005; H01L 25/0753; H01L 33/62; H05K 1/028; H05K 2201/10106; F21Y 2105/16; F21Y 2113/13; F21Y 2115/10
See application file for complete search history.

(56) References Cited

U.S. PATENT DOCUMENTS

| 10,948,141 | B1 * | 3/2021 | Machlis | ................. H05K 1/189 |
|---|---|---|---|---|
| 2013/0027637 | A1 * | 1/2013 | Hosoki | .................. G02B 6/009 |
| | | | | 362/249.02 |
| 2014/0288351 | A1 * | 9/2014 | Jones | ................... A61N 5/0624 |
| | | | | 607/90 |
| 2022/0018503 | A1 * | 1/2022 | Shen | ....................... F21S 41/26 |

OTHER PUBLICATIONS

International Search Report and Written Opinion for International Application No. PCT/US2022/050298, dated Apr. 12, 2023.

\* cited by examiner

*Primary Examiner* — Anne M Hines
*Assistant Examiner* — Jose M Diaz
(74) *Attorney, Agent, or Firm* — Polsinelli, PC (57) ABSTRACT

A flexible light emitting diode (LED) sheet operable to (i) produce light, (ii) enhance an amount of light and/or connected light-emitting diodes and/or sheets that can be daisy chained together, and (iii) lower wattage consumption. Lighting options include single color, color changing lighting, and pixel lighting.

19 Claims, 7 Drawing Sheets

FLEXIBLE LIGHT EMITTING DIODE (LED) SHEET SYSTEMS AND METHODS

CROSS-REFERENCE TO RELATED APPLICATION

This application claims priority under 35 U.S.C. § 119 to U.S. Provisional Patent Application Ser. No. 63/280,584 titled "FLEXIBLE LED SHEET OF LIGHT SYSTEMS AND METHODS" and filed Nov. 17, 2021, the entirety of which is incorporated herein by reference.

BACKGROUND

Signage, art, decorations, safety lighting, decor lighting, and many other products make use of different forms of illumination. However, creating a specialized illumination element to match the shapes of these products when can be difficult due to the need to create unique lighting arrangements, manage wires, and maintain connectivity and power while modifying the lighting circuitry. These difficulties can be compounded for complex three-dimensional objects with large intricate interior and exterior surfaces that may require lighting. Large scale customized light fixtures with complex wire configurations require significant time to construct and substantial power to operate.

It is with these observations in mind, among others, that various aspects of the presently disclosed technology were conceived and developed.

BRIEF SUMMARY

The aforementioned issues can be addressed using the technology disclosed herein. For instance a lighting system can include a flexible light emitting diode (LED) sheet operable to produce light, the flexible LED sheet including a plurality of conductive rows connecting a plurality of LEDs to form an LED array having one or more repeatable units. The lighting system can further include a plurality of evenly spaced lateral lines traversing the plurality of conductive rows to define a plurality of square or rectangle repeatable units. Additionally, the plurality of square or rectangle repeatable units can include a plurality of cutting or puncturing areas disposed between the plurality of conductive rows. The plurality of cutting or puncturing areas can have one or more fixture attachment puncture indicators. These one or more fixture attachment puncture indicators can be selectively included in a remaining portion of the flexible LED sheet during an LED sheet cutting process.

In some examples, LEDs corresponding to a conductive row of the plurality of conductive rows are electrically connected via a daisy chain configuration. Moreover, the lighting system can include a data path running adjacent to a plurality of rows of LEDs and connecting the plurality of rows of LEDs by running back and forth along the plurality of rows of LEDs and perpendicularly connecting the plurality of rows of LEDs at alternating ends. Additionally, the lighting system can include a plurality of SMD 3528 chips on the plurality of conductive rows with a one-to-one correspondence to a plurality of repeatable units. The plurality of SMD 3528 chips can communicate with one or more controllers of the lighting system. In some scenarios, the flexible LED sheet includes a plurality of repeatable units of LEDs electrically connected in a series. The one or more repeatable units can include a single repeatable unit of a plurality of repeatable units, the single repeatable unit containing a plurality of components. These components can include a first color LED, a second color LED, a third color LED, and/or a controller chip. Furthermore, the plurality of components can be on a conductive row and spaced apart from other repeatable units of the plurality of repeatable units by a plurality of cutting or puncturing areas and/or a plurality of lateral lines. The plurality of cutting or puncturing areas can run parallel to the plurality of conductive rows between the single repeatable unit and the other repeatable units; and/or the plurality of lateral lines can be perpendicular to the plurality of conductive rows.

In some instances, the lighting system further includes one or more fixation element indicators showing safe puncture areas within the plurality of cutting or puncturing areas. Additionally or alternatively, the lighting system includes one or more fixation element indicators showing the safe puncture areas on the plurality of lateral lines. The one or more fixation element indicators can include one or more screw or nail hole indicators to indicate where a fixation element may be extended through the flexible LED sheet without causing damage to the plurality of conductive rows and/or a data path. The lighting system can be operable to provide a single color of light; and a repeatable unit of the one or more repeatable units can include an SMD 3528 chip to control one or more LEDs of the repeatable unit.

In some examples, a lighting system includes a flexible light emitting diode (LED) sheet operable to produce light. The flexible LED sheet can include a plurality of rows of LEDs arranged along a plurality of parallel conductive rows electrically connecting the plurality of rows of LEDs to form an LED array. The LED array can have a plurality of repeatable units defined at least by a plurality of cutting or puncturing areas alternating with and running parallel to the plurality of rows of LEDs.

In some scenarios, individual repeatable units of the plurality of repeatable units include a corresponding 5050 chip and a corresponding CRI 95+ chip, designated to components of the individual repeatable units. Additionally, the system can be operable to provide color changing lighting with the 5050 chip and CRI 95+ chip designated to the individual repeatable units. The lighting system can also be operable to provide pixel lighting; and/or a repeatable unit of the plurality of repeatable units can include a 4040 chip and a WS2814 chip designated to LEDs of the repeatable unit. Moreover, the plurality of parallel conductive rows can alternate with a plurality of cutting or puncturing area rows, the plurality of cutting or puncturing area rows including a plurality of fixture element puncture indicators. By way of example, one or more connectors can be formed at an end of the flexible LED sheet for connecting the plurality of conductive rows to a power supply and/or a controller.

The foregoing summary is intended to be illustrative and is not meant in a limiting sense. Many features of the examples may be employed with or without reference to other features of any of the examples. Additional aspects, advantages, and/or utilities of the presently disclosed technology will be set forth in part in the description that follows and, in part, will be apparent from the description, or may be learned by practice of the presently disclosed technology.

BRIEF DESCRIPTION OF THE DRAWINGS

The foregoing summary, as well as the following detailed description, will be better understood when read in conjunction with the appended drawings. For the purpose of illustration, there is shown in the drawings certain examples of the disclosed subject matter. It should be understood, however, that the disclosed subject matter is not limited to the precise examples and features shown. The accompanying drawings, which are incorporated in and constitute a part of this specification, illustrate implementations of systems, methods, and devices consistent with the disclosed subject matter and, together with the description, serves to explain advantages and principles consistent with the disclosed subject matter, in which.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the examples described herein. However, it will be understood by those of ordinary skill in the art that the examples described herein can be practiced without these specific details. In other instances, methods, procedures and components have not been described in detail so as not to obscure the related relevant feature being described. Also, the description is not to be considered as limiting the scope of the examples described herein. The drawings are not necessarily to scale and the proportions of certain parts may be exaggerated to better illustrate details and features of the present disclosure.

I. Terminology

The phraseology and terminology employed herein are for the purpose of description and should not be regarded as limiting. For example, the use of a singular term, such as, "a" is not intended as limiting of the number of items. Further, it should be understood that any one of the features of the presently disclosed technology may be used separately or in combination with other features. Other systems, methods, features, and advantages of the presently disclosed technology will be, or become, apparent to one with skill in the art upon examination of the figures and the detailed description. It is intended that all such additional systems, methods, features, and advantages be included within this description, be within the scope of the presently disclosed technology, and be protected by the accompanying claims.

Further, as the presently disclosed technology is susceptible to examples of many different forms, it is intended that the present disclosure be considered as an example of the principles of the presently disclosed technology and not intended to limit the presently disclosed technology to the specific arrangements shown and described. Any one of the features of the presently disclosed technology may be used separately or in combination with any other feature. References to the terms "instances," "scenarios," "examples," and/or the like in the description mean that the feature and/or features being referred to are included in, at least, one aspect of the description. Separate references to these terms and/or the like in the description do not necessarily refer to the same example and are also not mutually exclusive unless so stated and/or except as will be readily apparent to those skilled in the art from the description. For example, a feature, structure, process, step, action, or the like described in one example may also be included in other examples, but is not necessarily included. Thus, the presently disclosed technology may include a variety of combinations and/or integrations of the examples described herein. Additionally, all aspects of the present disclosure, as described herein, are not essential for its practice. Likewise, other systems, methods, features, and advantages of the presently disclosed technology will be, or become, apparent to one with skill in the art upon examination of the figures and the description. It is intended that all such additional systems, methods, features, and advantages be included within this description, be within the scope of the presently disclosed technology, and be encompassed by the claims.

Any term of degree such as, but not limited to, "substantially," as used in the description and the appended claims, should be understood to include an exact, or a similar, but not exact configuration. The terms "comprising," "including" and "having" are used interchangeably in this disclosure. The terms "comprising," "including" and "having" mean to include, but not necessarily be limited to the things so described.

Lastly, the terms "or" and "and/or," as used herein, are to be interpreted as inclusive or meaning any one or any combination. Therefore, "A, B, or C" or "A, B, and/or C" mean any of the following: "A," "B," or "C"; "A and B"; "A and C"; "B and C"; "A, B and C." An exception to this definition will occur only when a combination of elements, functions, steps or acts are in some way inherently mutually exclusive.

II. General Architecture

Systems, methods, and devices disclosed herein can address the aforementioned issues with an improved flexible LED sheets that can accommodate quality LED chips, higher quality PCB circuits, and higher a quality pattern of lighting. The flexible LED sheet disclosed herein is more easily customized, can efficiently connect together with more additional sheets without requiring higher wattages, e.g., via a daisy chain, and can accommodate one or more screws through the sheets. The systems can provide a flexible LED Lighting sheet with a unique pattern of lighting to maximize the total number of LEDs that can be daisy chained in a series. This flexible LED light sheet that can be cut horizontal and/or vertically. The sheet can have multiple locations with markings to allow the use of a screw to penetrate one or more printed circuit boards (PCBs) located on the flexible LED light sheet to safely secure it to a surface (e.g., of an object being illuminated by the sheet).

The flexible LED light sheet can include multiple different PCB circuit designs, such as a single color LED arrangement, a multi-color/color changing LED arrangement, a single pixel color LED arrangement. and/or a color changing pixel LED arrangement. Furthermore, in any arrangement, the flexible LED light sheet can be operable for use with 12 V and can be manipulated/reconfigured for use with 5V or 24V. The technology disclosed herein can be used to backlight such material as acrylic and fabrics, for example, forming a sign. The technology can backlight any object while maximizing light output, light quantity, and can use a reduction in wattage.

As such, the technology disclosed herein can provide improved LED spacing and patterns that have a higher quantity of LED that can be in a continuous daisy chain with a total amount of LEDs able to connect to one point of power or one power source. The LEDs can be of a higher quality with the 200 watt power provided. Furthermore, the presently disclosed technology can advantageously consumers less power than previous systems, can advantageously function using a single point of contact for double the amount of size, can advantageously back light more surface area with less material and power consumption, and advantageously provide more options to mount the product via defined PCB locations to guide screws, when mounting, that easily penetrate through the PCB sheet without damaging any sensitive components such as any LEDs, wiring, switches, and the like, and/or can provide for easier and faster installation, and is operable to back light more surface area.

In some examples, the presently disclosed technology includes pixels secured to a flexible, cuttable sheet, and can have a unique scale/unique dimensions not available via any previous systems, which may be limited to small scales or are unable to be provided via larger scales given. For example, the flexible sheet can be a larger sheet with thousands of controllable LEDS without requiring additional connectors and/or breaking the sheet into multiple sheets. As such, the presently disclosed technology advantageously provides maximum capacity and, therefore, advantageously enables lighting control developers to increase capacity of control systems to control more LEDs using less resources and increase control and software capabilities. The presently disclosed technology can advantageously provide a higher lighting capacity using a continual daisy chained lighting system from a single connector. Furthermore, the presently disclosed technology can be manufactured using less material, and may be manufactured, assembled, cut to a customized shape, and/or operated easily without specialized skill. As such, the assemblies including tis technology can be assembled/installed faster with increased flexibility/adaptability. The end result products and/or illuminated objects can be illuminated while consuming less power, and with unique patterns and/or designs to accommodate an increased number of possible applications by an end user.

The presently disclosed technology may be utilized in various applications, such as backlighting acrylic and/or fabric, at tradeshows or exhibits, as part of an art installation, as informational signage, as interior lighting, as exterior lighting, and so forth.

In some examples, the LEDS can form an LED array having a spacing of approximately 1.5" between the LEDS (e.g., in a horizontal direction and a vertical direction). For instance, the LEDs can form a plurality of 1.5"×1.5" squares. With this configuration, the LEDs can provide optimal backlighting (e.g., for acrylics or fabrics) when coupled to the object being illuminated with a 3" spacing between the LED and the surface being illuminated. Furthermore, a plurality of LED sheets can be daisy chained together to form very large LED sheets and displays, (e.g., overcoming PCB machine manufacturing limitations). The LED sheets can be daisy chained together using a single wire lead connecting the ends of the LED sheets together, or the LED sheets may have connectors embedded in the LED strips for directly coupling together.

Additional advantages and benefits of the presently disclosed technology will become apparent from the detailed description below.

Figure 1:
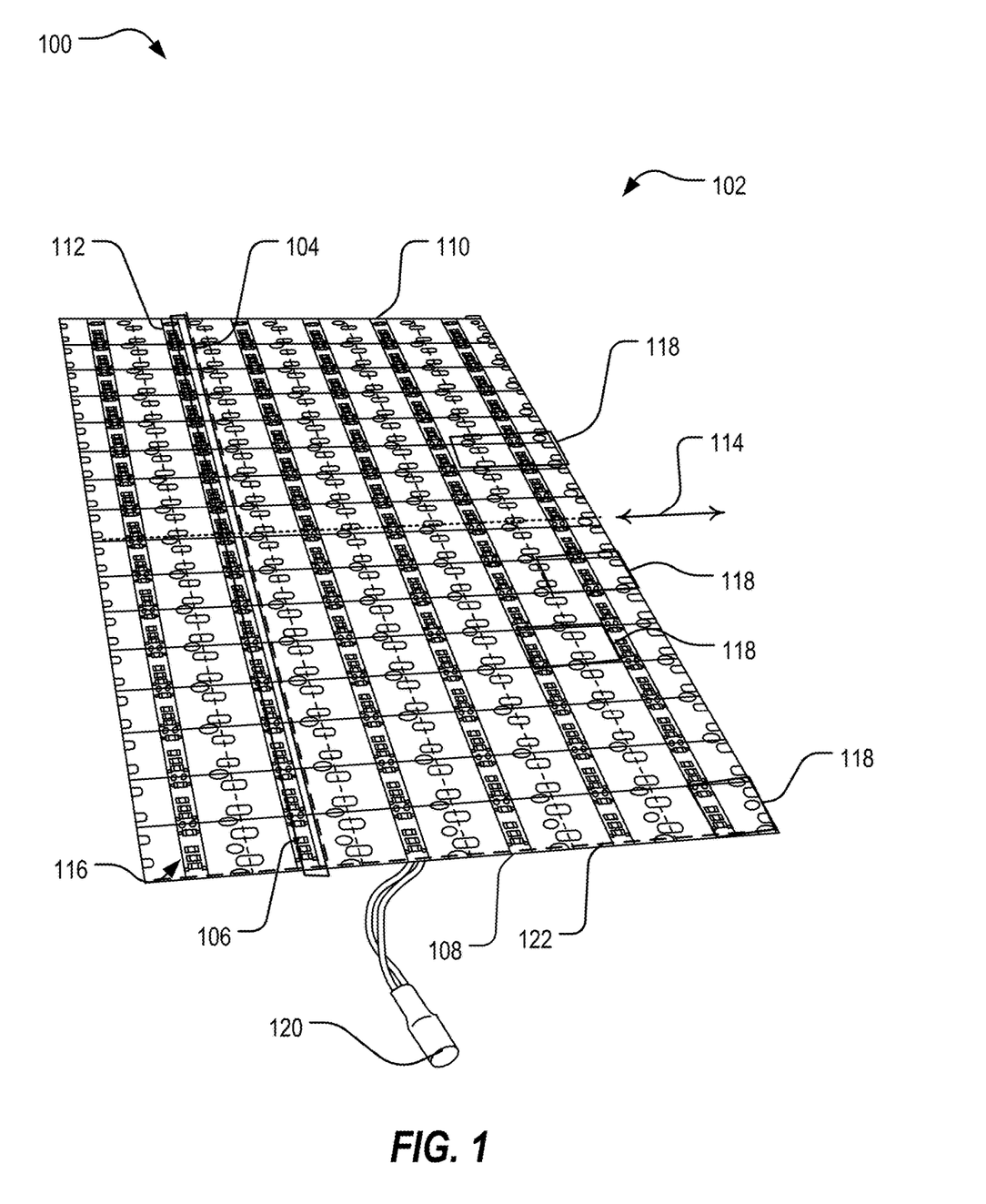
FIG. 1 illustrates an example system including a flexible light emitting diode (LED) sheet.

Turning to FIG. 1, a lighting system 100 can include a flexible LED sheet 102. The flexible LED sheet 102 can be formed of a flexible material, such as a flexible printed circuit board (PCB). The flexible LED sheet 102 can be operable to produce light, for instance, using a plurality of conductive rows 104 that connect a plurality of LEDs 106. For instance, the conductive row(s) 104 can be parallel to each other and can extend from a first end 108 of the flexible LED sheet 102 to a second end 110 of the flexible LED sheet 102. Each conductive rows 104 can provide power to the row of LEDs 112 on that particular conductive row 104. In some instances, the conductive rows 104 can be a conductive material (e.g., a metal lead) embedded in the flexible PCB material of the flexible LED sheet 102. The conductive rows 104 can correspond to rows of LEDs 112. The LEDs from the different rows of LEDs 112 can align in a lateral direction 114 (e.g., a direction perpendicular to the conductive rows 104, such that the LEDs form an LED array 116 or LED grid. In some scenarios, the flexible LED sheet 102 includes a power connector 120 disposed at an edge of the flexible LED sheet 102 (e.g., at the 108). The power connector 120 can connect to a power source and, using the conductive rows 104 as well as one or more conductive paths 122 traversing and/or connecting the conductive rows 104, provide power to the rows of LEDs 112. Furthermore, the flexible LED sheet 102 can include a plurality of power connectors 120 at the first end 108 and at the second end 112, such that the conductive rows 104 of one flexible LED sheet 102 can be connected, end-to-end, with one or more additional flexible LED sheets 102 using a daisy chain arrangement. In this way, the flexible LED sheet 102 can be expanded in size and lighting capacity. Additionally, portions of the flexible LED sheet 102 can be designated to be cut and/or punctured such that the flexible LED sheet 102 can be changed or reduced in size, such that the flexible LED sheet 102 can be fully customized in shape and size.

Figure 2:
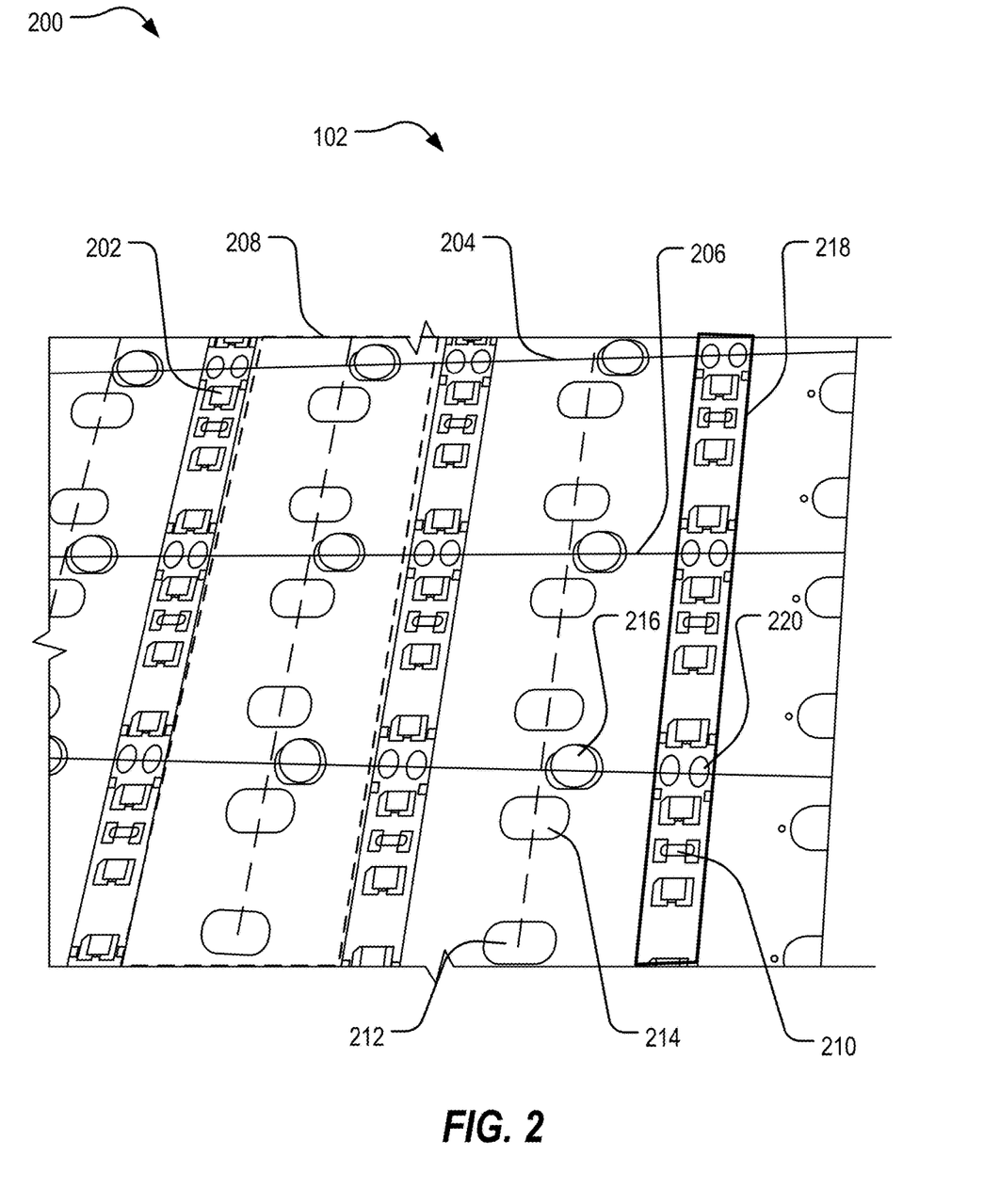
FIG. 2 illustrates an example system including a single color flexible LED sheet, which can be the same as or form at least a portion of the system of FIG. 1.

FIG. 2 illustrates an example lighting system 200 including the flexible LED sheet 102, which can be the same as or form at least a portion of the system 100 depicted in FIG. 1. The flexible LED sheet 102 depicted in FIG. 2 can be a single color flexible LED sheet 102.

In some examples, the flexible LED sheet 102 includes a plurality of repeating, discrete units (e.g., which can also be designated cuttable sections) that each include an LED 202 (or a defined set of LEDs, such as three LEDs) on a portion of the conductive rows 104. The repeatable unit 118 can be defined by a first lateral line 204, a second lateral line 206, and/or a cutting or puncturing area 208. The lateral lines 204 and 206 can run perpendicular to the conductive rows 104 and the cutting or puncturing area 208. The lateral lines 204 and/or 206 can include one or more ink lines, perforations, colored ink lines (e.g., black lines), creases, and/or other indicator of the designated lateral lines. In some instances, the lateral lines 204 and/or 206 can be cutting lines showing a designated path for trimming the flexible LED sheet 102. The lateral lines 204 and/or 206 can designate discrete units, provide dimension information, and/or be used as a visual aid for identifying the fixture attachment puncture indictors. Additionally, the lines 204 can evenly spaced apart from each other, and a plurality of cutting or puncturing areas 208 can also evenly spaced apart from each other (e.g., with the lines 204 running perpendicular to the direction of the rows of cutting or puncturing areas 208). As such, the plurality of lines 204 can traverse the plurality of conductive rows 104 to define the repeatable unit 118 as square or rectangle repeatable unit 118. The one or more repeatable unit 118 can be substantially uniform in size and shape and can be scaled up in a repetitive pattern arrangement to include hundreds or thousands of LEDs. Additionally or alternatively, the one or more conductive paths 122 can be represented by printed ink or markings on the surface of the flexible LED sheet 102, showing were cutting and/or puncturing is to be avoided.

Furthermore, in some scenarios, the flexible LED sheet 102 includes a control chip 210 disposed on the conductive row 104. For instance, each repeatable unit 118 can have a control chip 210 designated to control components of that repeatable unit 118 (e.g., the LED 202 or the set of LEDs corresponding to the repeatable unit). By way of example, the control chip 210 can be an SMD 3528 chip (e.g., in scenarios for controlling a single LED color). One or more data paths, running parallel to the conductive rows 104, can connect the control chips 210, as discussed in greater detail below. In other words, the flexible LED sheet 102 can include a plurality of control chip 210 (e.g., a plurality of SMD 3528 chips) on the plurality of conductive rows 104 with a one-to-one correspondence to the plurality of repeatable unit 118, such that the individual repeatable units each have their own designated control chip 210.

In some instances, the flexible LED sheet 102 can include one or more fixture attachment puncture indicators providing an indication of designated areas on the flexible LED sheet 102 that can be punctured without damaging any of the functional components of the flexible LED sheet 102 (e.g., the conductive rows 104, the data path, the LEDs 202, etc.). For instance, the cutting or puncturing area 208 can include a first fixture attachment puncture indicator 212 and a second fixture attachment puncture indicator 214. Moreover, a lateral line 206 separating the cutting or puncturing areas 208 and/or the repeatable units can include a third fixture attachment puncture indicator 216. Furthermore, an LED area 218 (e.g., that includes the conductive rows 104 and the LEDs 202) can include a fourth fixture attachment puncture indicator 220 (which can also be along the lateral line 206. These fixture attachment puncture indicators can include an indication color (e.g., red) that is a different color than other portions of the surface of the flexible LED sheet 102. Additionally or alternatively, these fixture attachment puncture indicators can include one or more of an indent, perforations, or other features to assist in removing or puncturing the flexible PCB at the fixture attachment puncture indicators, and/or to provide tactile feedback for identifying the fixture attachment puncture indicators. The plurality of fixture attachment puncture indicators throughout multiple repeatable unit 118 can form a repeating pattern of fixture attachment puncture indicators.

Furthermore, in some instances, the LEDs of a conductive row 104 can be electrically connected to other conductive rows 104 of other flexible LED sheet 102 via a daisy chain configuration and/or in a series. The daisy chain configuration can wire the LEDs and/or the repeatable units together in a sequence, creating redundant loops back to the power supply. In some scenarios, portions of the flexible LED sheet 102 can be severed from a remaining portion without this severing impacting the circuitry of the remaining portion of the flexible LED sheet 102, or the ability to provide power and/or data to the remaining repeatable units of the remaining portion of the flexible LED sheet 102. In some instances, the circuitry arrangement of conductive rows 104 and/or lateral conductive paths 122 can provide a constant voltage to the LEDS during operation of the flexible LED sheet 102. In some scenarios, the power supply can provide a 200 watt power supply to the flexible LED sheet 102, which can improve energy efficiency of the system 200.

In some instances, a user of the flexible LED sheet 102 can cut the flexible LED sheet 102 to any desired shape and size. The user can cut in the designated cutting or puncturing area 208 and/or along the lines (e.g., line 204 and/or line 206). During this customization sheet cutting process, the user can cut around one or more of the fixture attachment puncture indicators to ensure that a remaining portion of the flexible LED sheet 102 includes the fixture attachment puncture indicator and material around the fixture attachment puncture indicators. This technique for selectively including the fixture attachment puncture indicators in the customized or cut flexible LED sheet 102 can provide multiple attachment areas around a border of the customized or cut flexible LED sheet 102 for mounting the customized or cut flexible LED sheet 102 to an illumination object (e.g., a sign, a display, an art installation, etc.). In some scenarios, the customized border of the flexible LED sheet 102, including the fixture attachment puncture indicators, can correspond or match with a border, shape, or size of the illumination object onto which the flexible LED sheet 102 is installed. A fixture element (e.g., a nail or a screw) can be extended through the flexible LED sheet 102 at the fixture attachment puncture indicators without causing damage to the elements of the flexible LED sheet 102. The lighting system 200 can include the flexible LED sheet 102 with an adhesive material (e.g., a tape or a glue) disposed on a rear side of the flexible LED sheet 102 (e.g., opposite the front side 226 including the LEDs 202).

Figure 3:
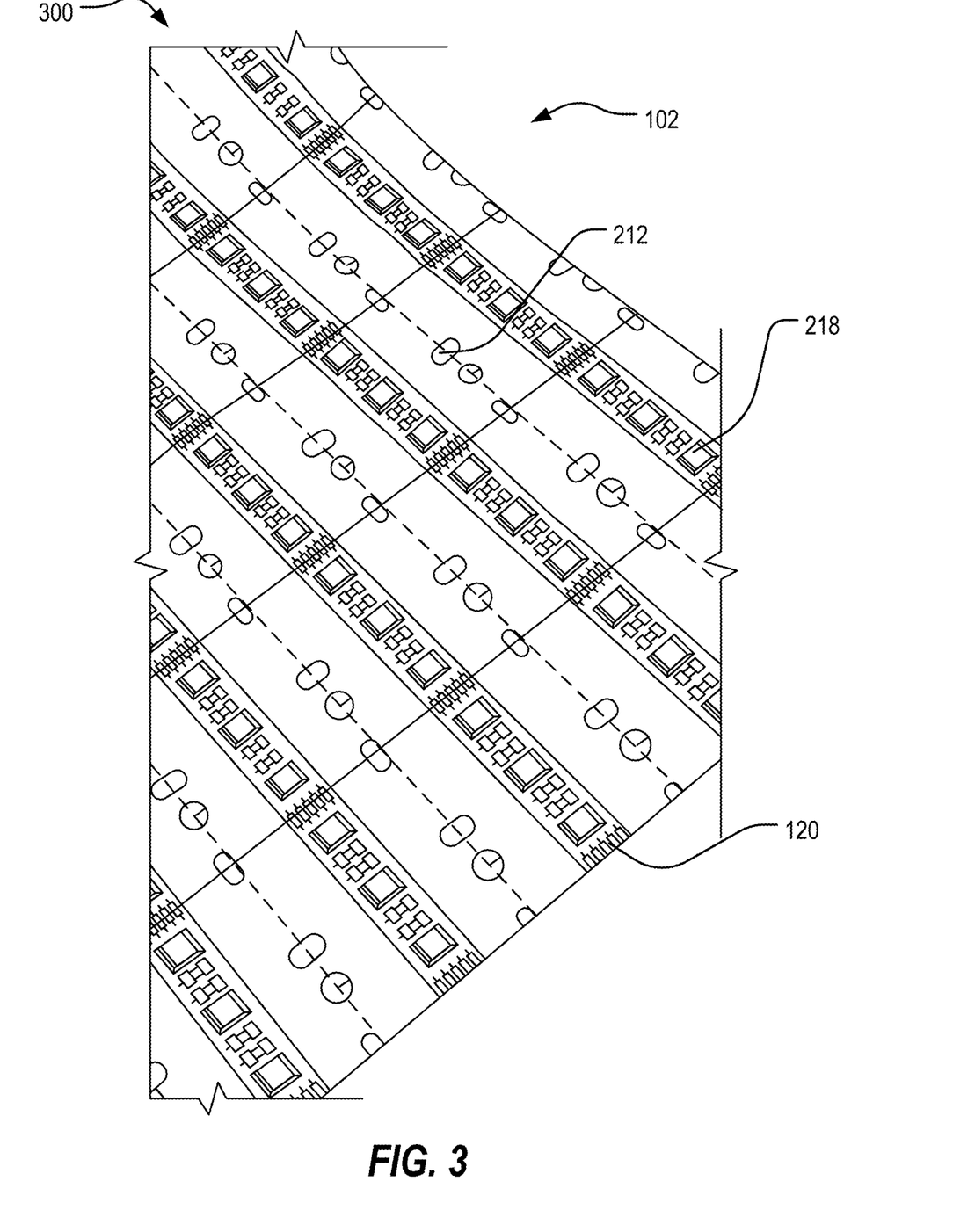
FIGS. 3 illustrates an example system including a multi-color flexible LED sheet, which can be the same as or form at least a portion of the system of FIG. 1.

FIG. 3 illustrates an example system 300 including the flexible LED sheet 102, which can be the same as or form at least a portion of the system 100 depicted in FIG. 1. As depicted in FIG. 3, the flexible LED sheet 102 can be a red-green-blue-white (RGBW) flexible LED sheet 102.

For example, the repeatable unit 118 can each include a set of three LEDs, such as a red LED, a green LED, and a blue LED. Additionally or alternatively, the flexible LED sheet 102 can include a plurality of SMD 5050 chips and/or a plurality of CRI 95+ LED chips. For instance, an individual repeatable unit 118 can have a designated SMD 5050 chip and/or a designated CRI chip for controlling the components (e.g., the red LED, the green LED, and the blue LED) of that particular repeatable unit 118. This plurality of components can form a discrete unit of the flexible LED sheet 102, which can be repeated throughout the flexible LED sheet 102 forming the plurality of repeatable unit 118. Moreover, the plurality of components of the repeatable unit 118 can be in a line on a portion/section of the conductive row 104, in the LED area 218, and spaced apart from other repeatable units by the cutting or puncturing areas 208 on either side of the LED area 218. The cutting or puncturing areas 208 can run parallel with the LED area 218, and can be positioned between the individual repeatable units. As such, the plurality of cutting or puncturing areas 208 can alternate with the plurality of LED areas 218 containing the conductive rows 104 and the LEDs 202. Moreover, the plurality of rows of cutting or puncturing areas 208 can space the repeatable unit 118 apart from other repeatable units. The plurality of lateral lines 204, perpendicular to the conductive row 104 and the LED area 218, can also space the repeatable unit 118 apart from other repeatable units.

Figure 4A:
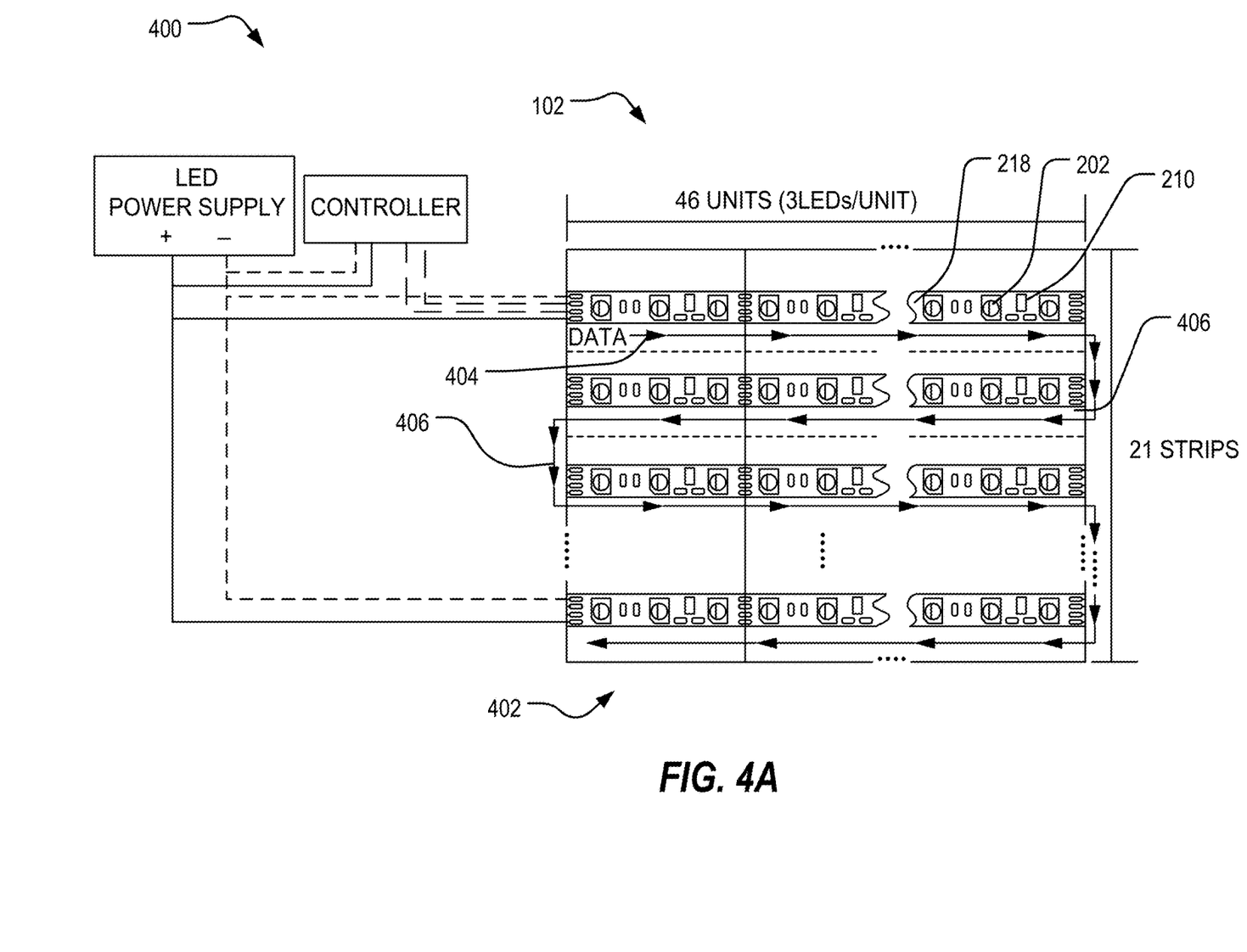
FIGS. 4A and 4B illustrate an example system including a pixel LED sheet, which can be the same as or form at least a portion of the system of FIG. 1.
Figure 4B:
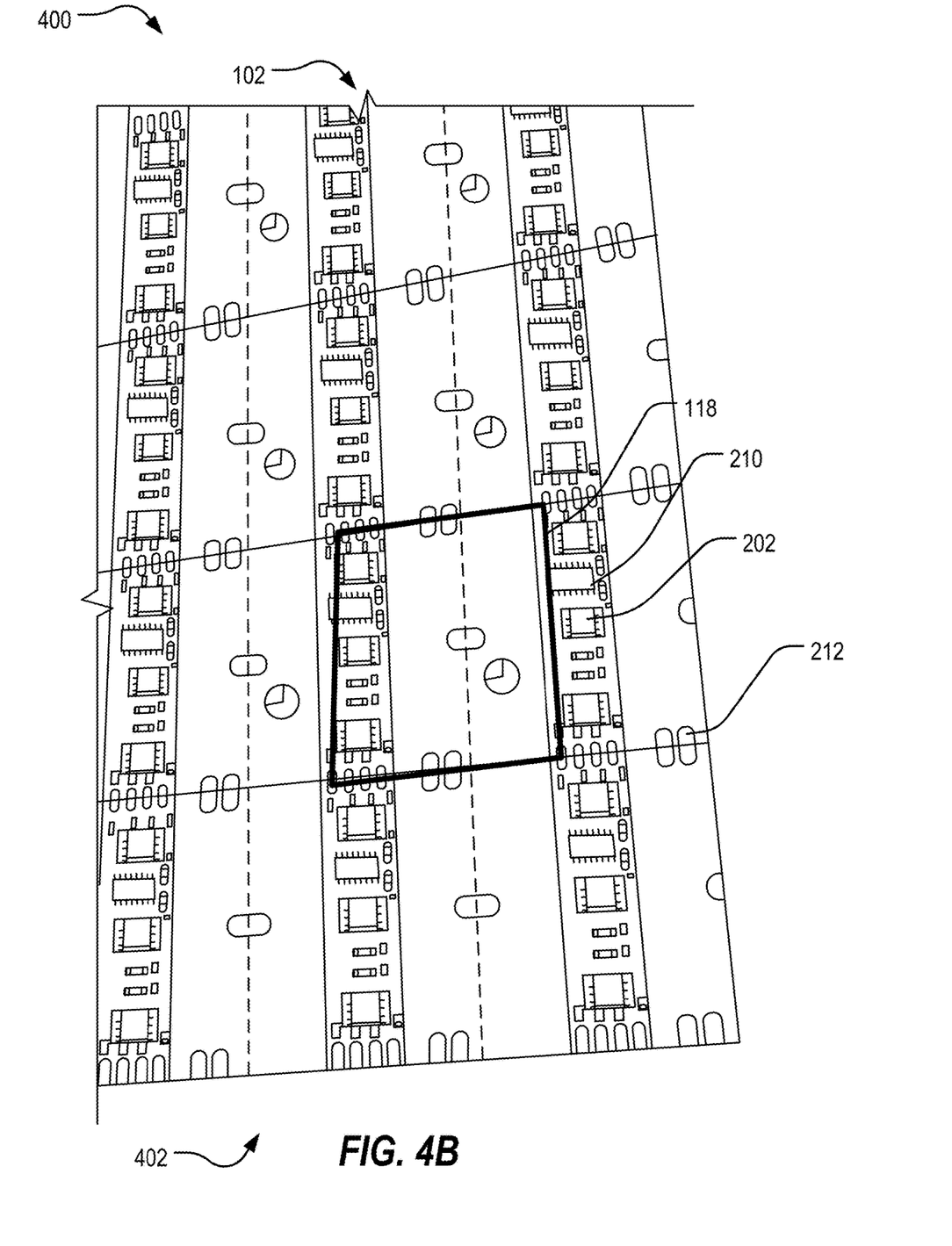

FIGS. 4A and 4B illustrate an example system 400 including the flexible LED sheet 102, which can be the same as or form at least a portion of the system 100 depicted in FIG. 1. As depicted in FIGS. 4A and 4B, the flexible LED sheet 102 can be a pixel LED sheet 402 for creating a pixel display.

In some instances, the flexible LED sheet 102 is the pixel LED sheet 402 with the individual repeatable unit 118 having a red LED, a green LED, and a blue LED. Moreover, the repeatable unit 118 can each include a SMD 4040 chip designated to the components of the particular repeatable unit 118. Additionally or alternatively, the individual repeatable unit 118 can have their own designated WS2814 chip for controlling the components of the individual repeatable units. Accordingly the chips on the flexible LED sheet 102 can control the pixel LEDS to present pictures and/or video. Additionally, the pixel LED sheet 402 can be cut to a customized shape and/or size, for instance, along the cutting or puncturing areas 208 and/or the lateral lines 204

In some examples, the flexible LED sheet 102 can include a data path 404 formed with a data line, trace, or wire embedded in the flexible PCB. In some instances, the data path 404 runs within the LED area 218, adjacent to the LED are 218, adjacent to the plurality of rows of LEDs 112 (e.g., and the conductive rows 104). The data path 404 can be a single continuous data path (e.g., omitting branches) that runs, snakes, or zig-zags back and forth along the plurality of rows of LEDs 112. For instance, the data path 404 can connect the different rows of LEDs 112 perpendicularly at alternating ends 406 of the rows of LEDs 112, forming the single, continuous data path 404. Additionally or alternatively, the data path 404 can include one or more branches running parallel to or traversing the rows of LEDs 112. As such, the data path 404 can provide control signals to the components of the repeatable unit 118 from a controller, as discussed below.

Figure 5:
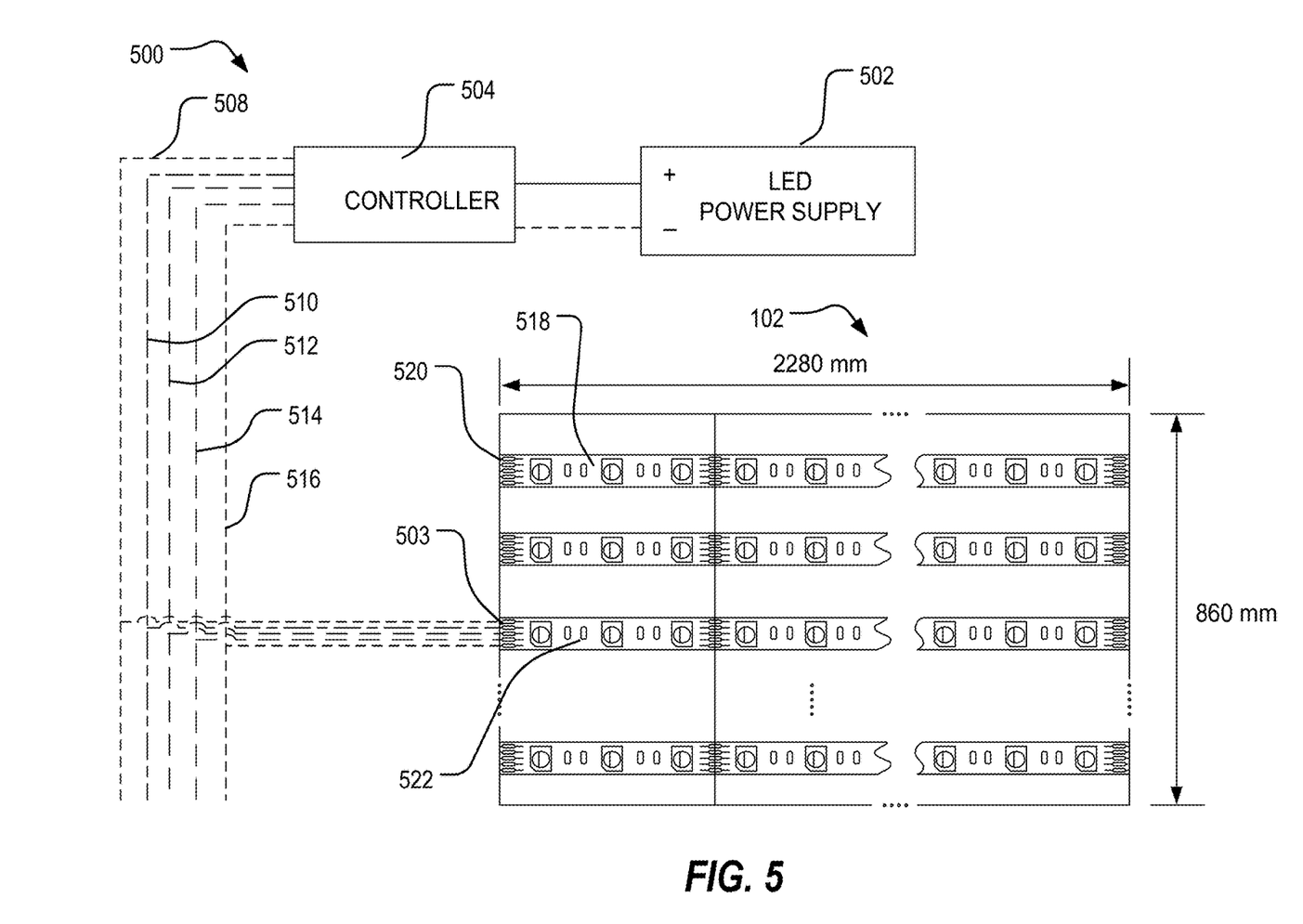
FIG. 5 illustrates an example system including a flexible LED sheet with a power supply and/or a controller, which can be the same as or form at least a portion of the system of FIG. 1.

FIG. 5 illustrates an example system 500 including the flexible LED sheet 102 and a power supply 502. The system 500 depicted in FIG. 5 can be the same or form at least a portion of the system depicted in FIG. 1.

In some scenarios, as depicted in FIG. 5, the flexible LED sheet 102 can be the RGBW multi-color flexible LED sheet 102 and/or can include the plurality of SMD 5050 chips with CRI 95+ chips. The flexible LED sheet 102 can include the power connector 120 and a data connector 503, which can be integrated with and/or separate from the power connector 120. In some instances, a controller 504 can include five leads 506 communicatively coupled to the power supply 502 at five terminals at an edge or end 108 of the flexible LED sheet 102. The leads 506 of the controller 504 can include one or more power leads 508, a green LED lead 510, a blue LED lead 512, a red LED lead 514, and/or a chip lead 516. These leads 506 of the controller can connect to the data path 404 and/or the conductive rows 104 on the flexible LED sheet 102, for instance, at an end of the row at the first end 108 or the second end 110. The leads can attach to a data connection on a side row 518 of the flexible LED sheet 102, for instance, at a corner 520 of the flexible LED sheet 102. Additionally or alternatively, the data connection can be at an interior row 522, or a middle row, of the flexible LED sheet 102. The flexible LED sheet 102 can include a single data connection or multiple data connections distributed along edges of the flexible LED sheet 102. The controller 504 can also connect to and receive power from an LED power supply 502, which the controller 504 can convert to the 200 W and/or 12V DC power supply for the conductive rows 104. The flexible LED sheet 102 can be a single color flexible LED sheet 102. The flexible LED sheet 102 can have two leads, a positive lead and a negative lead, which connect to the LED power supply 502.

Figure 6:
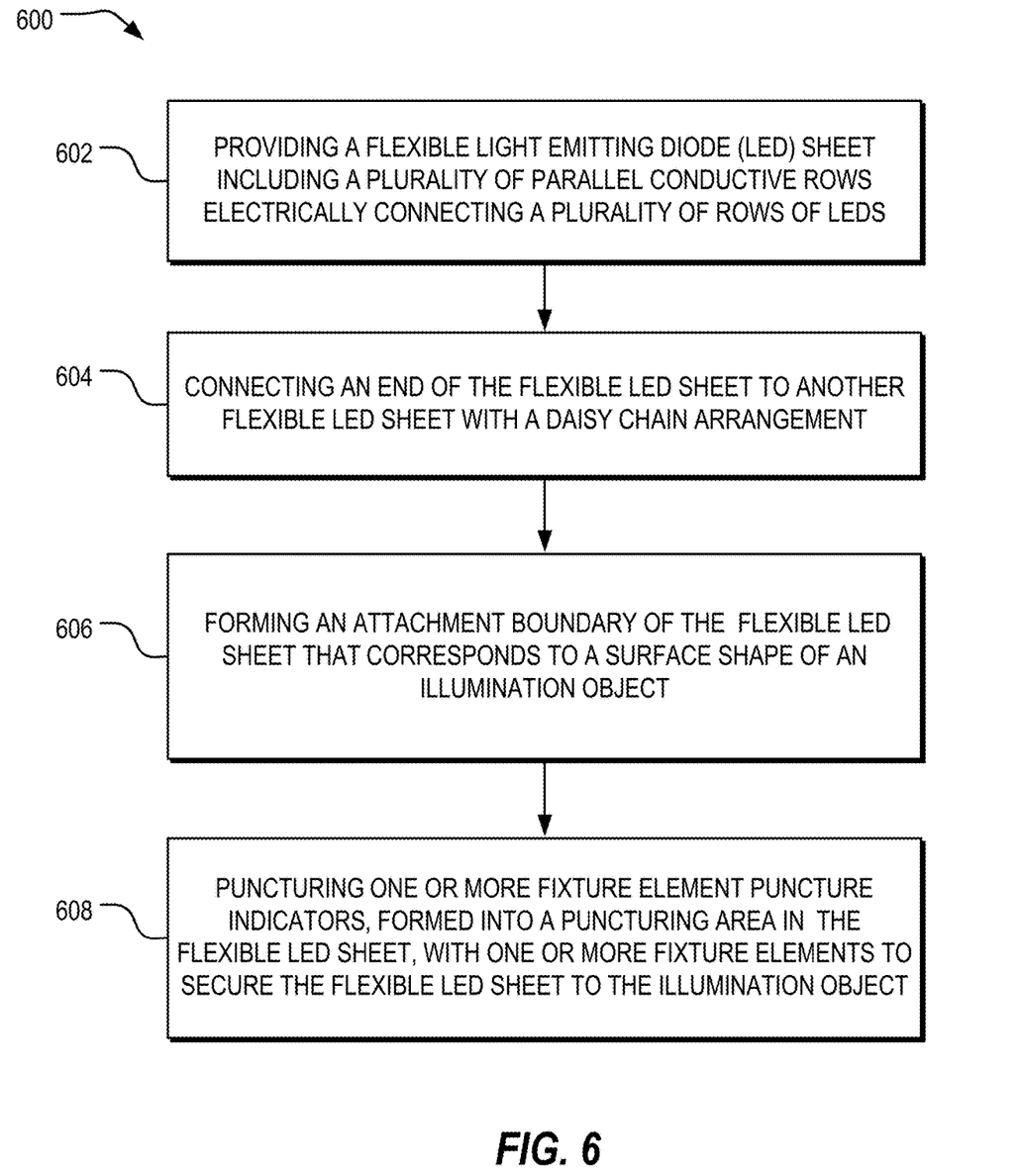
FIG. 6 illustrates an example method the can be performed with the systems depicted in FIGS. 1-5.

FIG. 6 illustrates an example method 600 for forming a lighting system, which can be performed by the systems 100-500 disclosed herein.

At operation 602, the method 600 can provide a flexible light emitting diode (LED) sheet including a plurality of parallel conductive rows electrically connecting a plurality of rows of LEDs. At operation 604, the method 600 can connect an end of the flexible LED sheet to another flexible sheet with a daisy chain arrangement. At operation 606, the method 600 can form an attachment boundary of the flexible ELD sheet that corresponds to a surface shape of an illumination object. At operation 608, the method 600 can puncture one or more fixture element puncture indicators, formed into the puncturing area in the flexible LED sheet, with one or more fixture elements to secure the flexible LED sheet to an illumination object.

It is to be understood that the specific order or hierarchy of steps in the method(s) depicted in FIG. 6 and throughout this disclosure are instances of example approaches and can be rearranged while remaining within the disclosed subject matter. For instance, any of the operations depicted in FIG. 6 and throughout this disclosure may be omitted, repeated, performed in parallel, performed in a different order, and/or combined with any other of the operations depicted in FIG. 6 and throughout this disclosure.

While the presently disclosed technology has been described with reference to various implementations, it will be understood that these implementations are illustrative and that the scope of the presently disclosed technology is not limited to them. Many variations, modifications, additions, and improvements are possible. More generally, implementations in accordance with the presently disclosed technology have been described in the context of particular implementations. Functionality may be separated or combined differently in various implementations of the disclosure or described with different terminology. These and other variations, modifications, additions, and improvements may fall within the scope of the disclosure as defined in the claims that follow.

What is claimed is:

1. A lighting system comprising:
   a flexible light emitting diode (LED) sheet operable to produce light, the flexible LED sheet including a plurality of conductive rows connecting a plurality of LEDs to form an LED array having one or more repeatable units,
   wherein,
   the lighting system is operable to provide pixel lighting, and
   a repeatable unit of the plurality of repeatable units includes a 4040 chip and a WS2814 chip designated to LEDs of the repeatable unit.

2. The lighting system of claim 1, further comprising:
   a plurality of evenly spaced lines traversing the plurality of conductive rows to define a plurality of square or rectangle repeatable units.

3. The lighting system of claim 2,
   wherein,
   the plurality of square or rectangle repeatable units include a plurality of cutting or puncturing areas, disposed between the plurality of conductive rows, and having one or more fixture attachment puncture indicators, such that the one or more fixture attachment puncture indicators can be selectively included in a remaining portion of the flexible LED sheet during an LED sheet cutting process.

4. The lighting system of claim 3,
wherein,
LEDs corresponding to a conductive row of the plurality of conductive rows are electrically connected to another flexible LED sheet via a daisy chain configuration.

5. The lighting system of claim 1, further comprising:
a data path running adjacent to a plurality of rows of LEDs and connecting the plurality of rows of LEDs by running back and forth along the plurality of rows of LEDs and perpendicularly connecting the plurality of rows of LEDs at alternating ends.

6. The lighting system of claim 1, further comprising:
a plurality of SMD 3528 chips on the plurality of conductive rows with a one-to-one correspondence to a plurality of repeatable units, the plurality of SMD 3528 chips communicating with a controller of the lighting system.

7. The lighting system of claim 1,
wherein,
the flexible LED sheet includes a plurality of repeatable units of LEDs electrically connected in a series.

8. The lighting system of claim 1,
wherein,
the one or more repeatable units include a single repeatable unit of a plurality of repeatable units, the single repeatable unit containing a plurality of components including a first color LED, a second color LED, a third color LED, and a controller chip, the plurality of components being on a conductive row and spaced apart from other repeatable units of the plurality of repeatable units by:
a plurality of cutting or puncturing areas running parallel to the plurality of conductive rows between the single repeatable unit and the other repeatable units, and
a plurality of lines perpendicular to the plurality of conductive rows.

9. The lighting system of claim 8, further comprising:
one or more fixation element indicators showing safe puncture areas within the plurality of cutting or puncturing areas.

10. The lighting system of claim 9,
wherein,
the one or more fixation element indicators show the safe puncture areas on the plurality of lines.

11. The lighting system of claim 9,
wherein,
the one or more fixation element indicators include one or more screw hole indicators to indicate where a fixation element may be extended through the flexible LED sheet without causing damage to the plurality of conductive rows or a data path.

12. The lighting system of claim 1,
wherein,
the system is operable to provide a single color of light; and
a repeatable unit of the one or more repeatable units includes an SMD 3528 chip to control one or more LEDs of the repeatable unit.

13. A lighting system operable to provide pixel lighting comprising:
a flexible light emitting diode (LED) sheet operable to produce light, the flexible LED sheet including a plurality of rows of LEDs arranged along a plurality of parallel conductive rows electrically connecting the plurality of rows of LEDs to form an LED array, the LED array having a plurality of repeatable units defined at least by a plurality of cutting or puncturing areas alternating with and running parallel to the plurality of rows of LEDs, a repeatable unit of the plurality of repeatable units includes a 4040 chip and a WS2814 chip designated to LEDs of the repeatable unit.

14. The lighting system of claim 13,
wherein,
individual repeatable units of the plurality of repeatable units include a corresponding 5050 chip and a corresponding CRI 95+ chip, designated to components of the individual repeatable units; and
the system is operable to provide color changing lighting with the corresponding 5050 chip and the corresponding CRI 95+ chip designated to the individual repeatable units.

15. The lighting system of claim 1, further comprising:
one or more connectors formed at an end of the flexible LED sheet for connecting the plurality of conductive rows to a power supply.

16. The lighting system of claim 13,
wherein,
the plurality of parallel conductive rows alternate with a plurality of cutting or puncturing area rows, the plurality of cutting or puncturing area rows including a plurality of fixture element puncture indicators.

17. A method of forming a lighting system to provide pixel lighting, the method comprising:
providing a flexible light emitting diode (LED) sheet including a plurality of repeatable units having a plurality of parallel conductive rows electrically connecting a plurality of rows of LEDs, a repeatable unit of the plurality of repeatable units includes a 4040 chip and a WS2814 chip designated to LEDs of the repeatable unit;
connecting an end of the flexible LED sheet to another flexible LED sheet with a daisy chain arrangement;
forming an attachment boundary of the flexible LED sheet that corresponds to a surface of an object; and
puncturing one or more fixture element puncture indicators, formed into a puncturing area in the flexible LED sheet, with one or more fixture elements to secure the flexible LED sheet to an illumination object.

18. The method of claim 17,
wherein,
forming the attachment boundary includes trimming a repeatable unit from the flexible LED sheet such that a shape of the flexible LED sheet corresponds to a surface shape of the illumination object.

19. The method of claim 17,
wherein,
the one or more fixture element puncture indicators are first indicators, and further comprising providing second indicators disposed along one or more lines formed into the flexible LED sheet and aligned perpendicularly with the plurality of parallel conductive rows.

* * * * *